(12) United States Patent
Takahashi

(10) Patent No.: US 6,507,068 B2
(45) Date of Patent: *Jan. 14, 2003

(54) FLASH MEMORY DEVICE AND A FABRICATION PROCESS THEREOF

(75) Inventor: Satoshi Takahashi, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/160,046

(22) Filed: Sep. 25, 1998

(65) Prior Publication Data

US 2001/0019149 A1 Sep. 6, 2001

(30) Foreign Application Priority Data

Mar. 17, 1998 (JP) .......................................... 10-066898

(51) Int. Cl.[7] .............................................. H01L 29/788
(52) U.S. Cl. ....................... 257/315; 257/316; 257/317; 257/321
(58) Field of Search ................................ 257/315, 321, 257/316, 317, 314, 319; 438/257, 263, 264

(56) References Cited

U.S. PATENT DOCUMENTS

| 4,500,899 | A | * | 2/1985 | Shirai et al. ................. | 257/315 |
| 5,270,240 | A | * | 12/1993 | Lee ............................. | 438/257 |
| 5,652,447 | A | * | 7/1997 | Chen et al. .................. | 257/315 |
| 5,736,442 | A | * | 4/1998 | Mori ........................... | 438/257 |

OTHER PUBLICATIONS

An EEPROM Cell with Asymetrical Sidewall to Minimize Drain Couplings, Apr. 1, 1993, IBM Technical Disclosure Bulletin, vol. 36, Issue No. 4, pp. 45–48. (TDB–ACC–No: NN930445).*

* cited by examiner

Primary Examiner—Tom Thomas
Assistant Examiner—Thien F Tran
(74) Attorney, Agent, or Firm—Armstrong, Westerman & Hattori, LLP

(57) ABSTRACT

A NOR-type flash memory device includes a source region, a drain region and a source line connecting the source region of a memory cell transistor to an source region of an adjacent memory cell transistor in the form of diffusion regions formed in a substrate, wherein the drain region and the source line are formed simultaneously after the step of forming the source region.

3 Claims, 19 Drawing Sheets

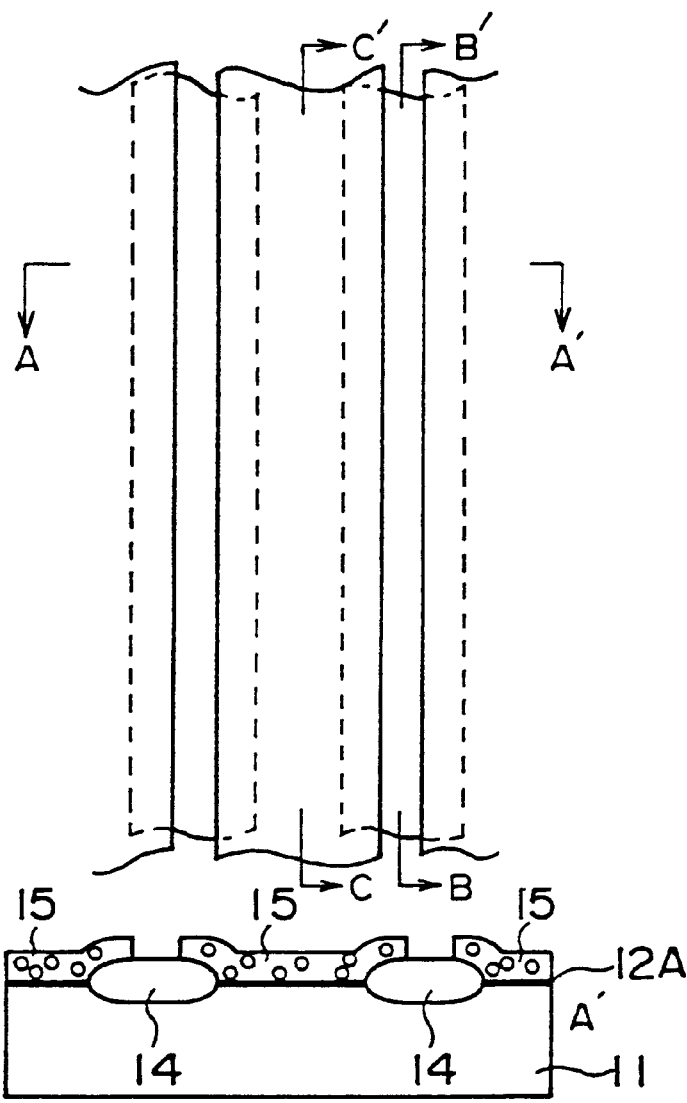
FIG. 2A PRIOR ART
FIG. 2B PRIOR ART
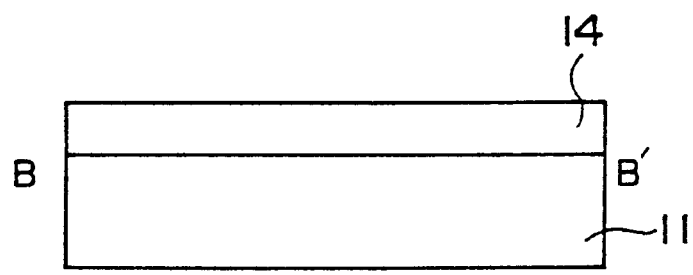
FIG. 2C PRIOR ART
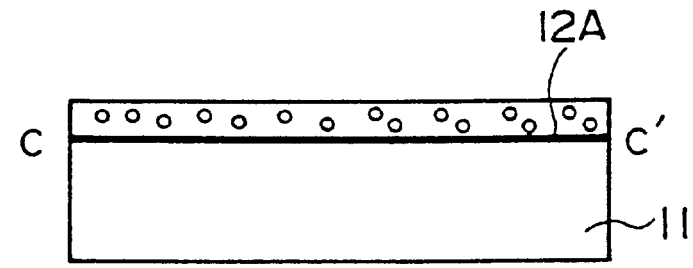
FIG. 2D PRIOR ART

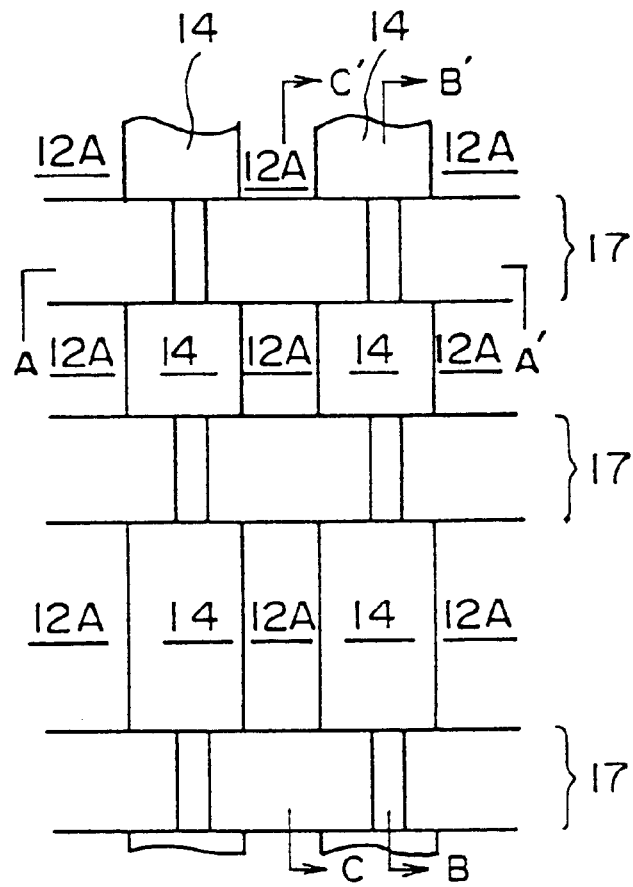
FIG. 5A
PRIOR ART
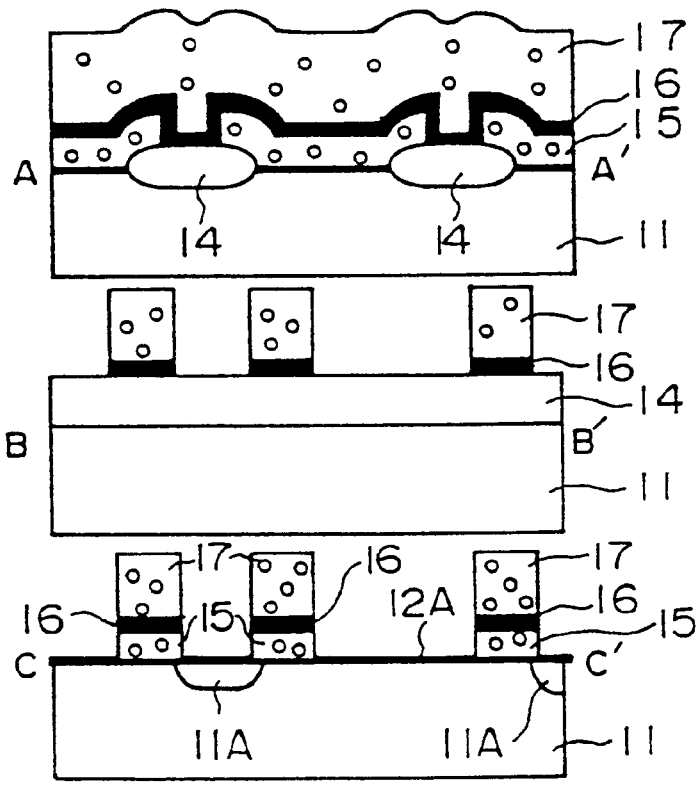
FIG. 5B
PRIOR ART
FIG. 5C
PRIOR ART
FIG. 5D
PRIOR ART

TO ERASE POWER SUPPLY

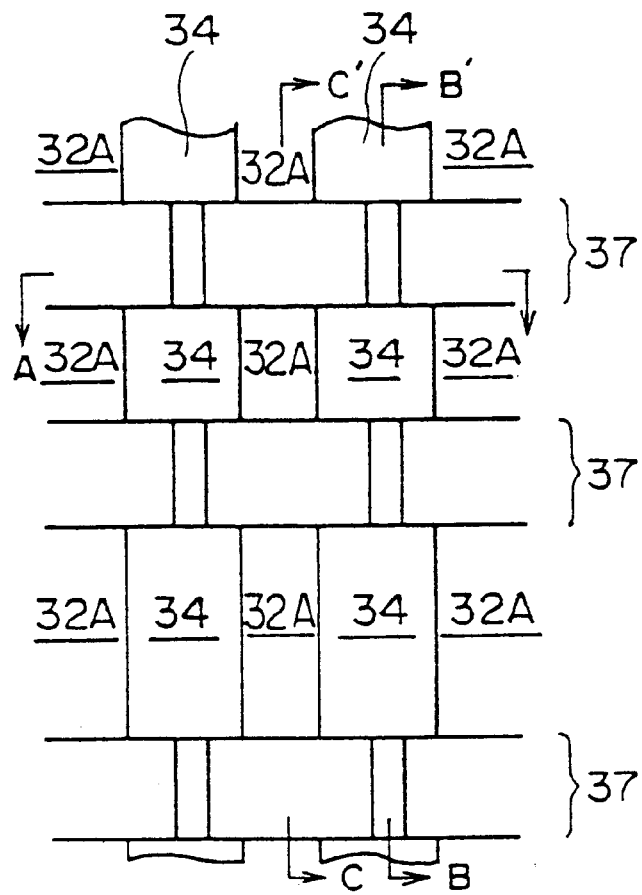
FIG. 15A
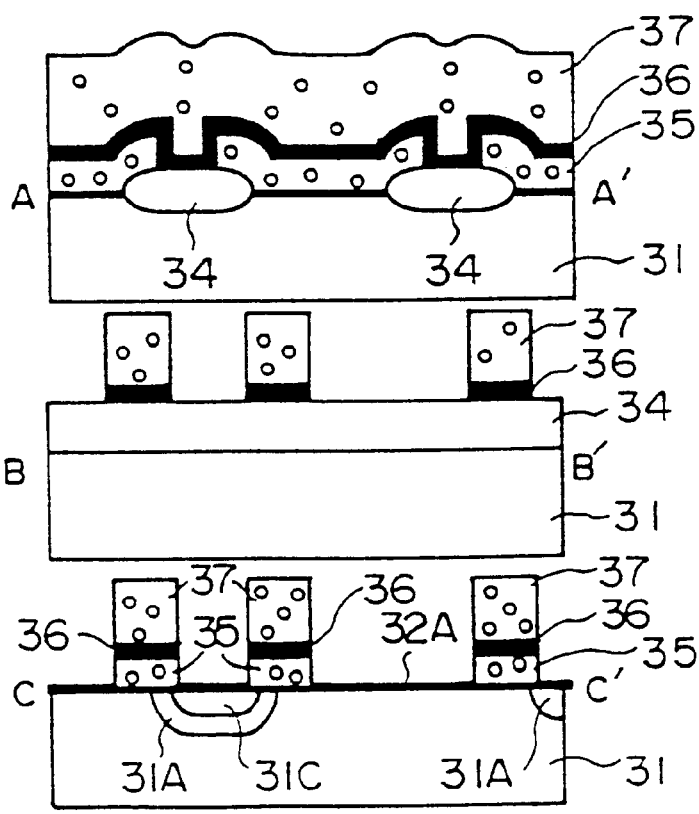
FIG. 15B
FIG. 15C
FIG. 15D

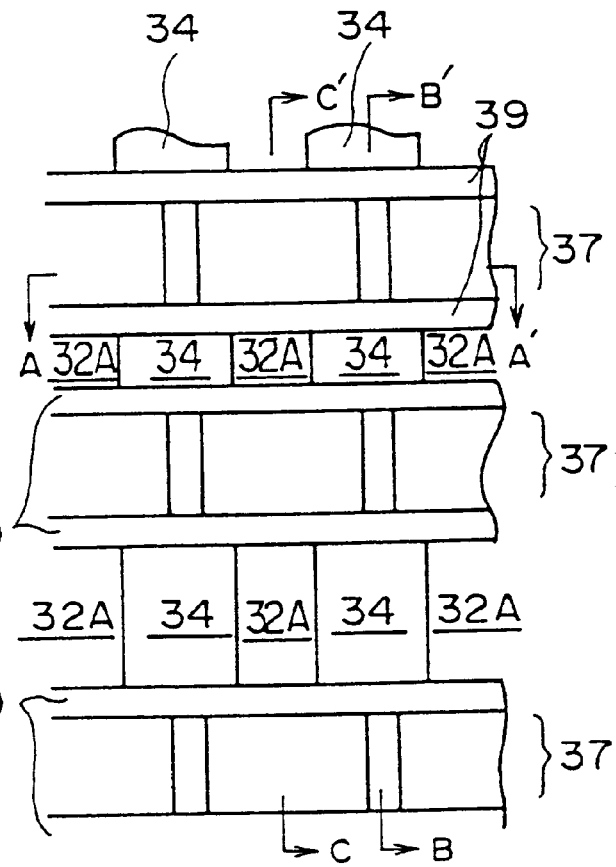
FIG. 16A
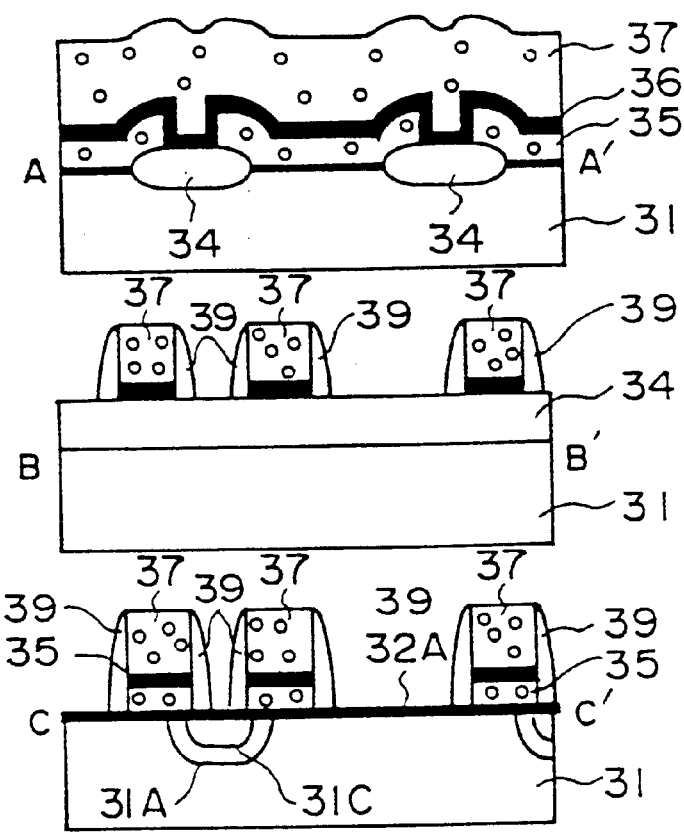
FIG. 16B
FIG. 16C
FIG. 16D

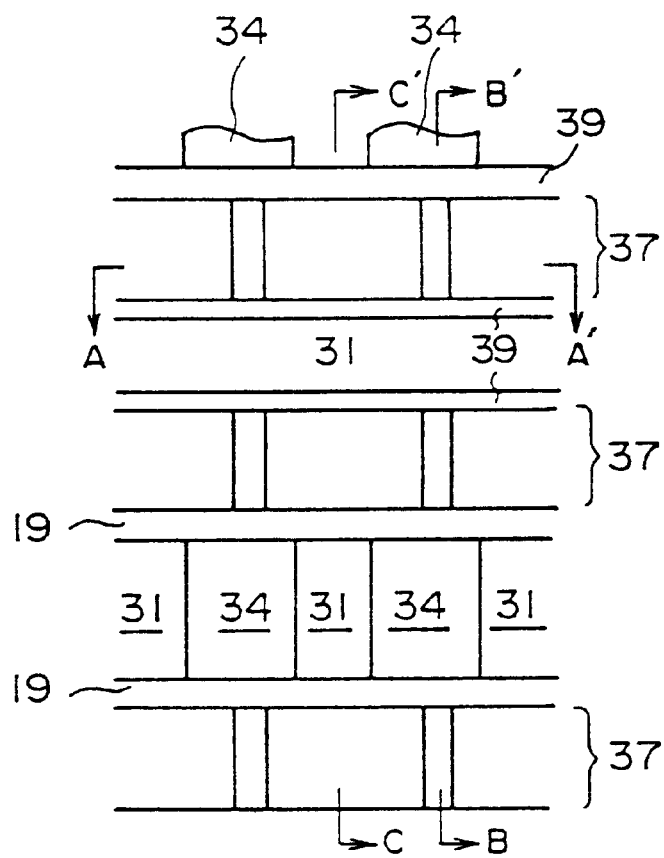
FIG. 18A
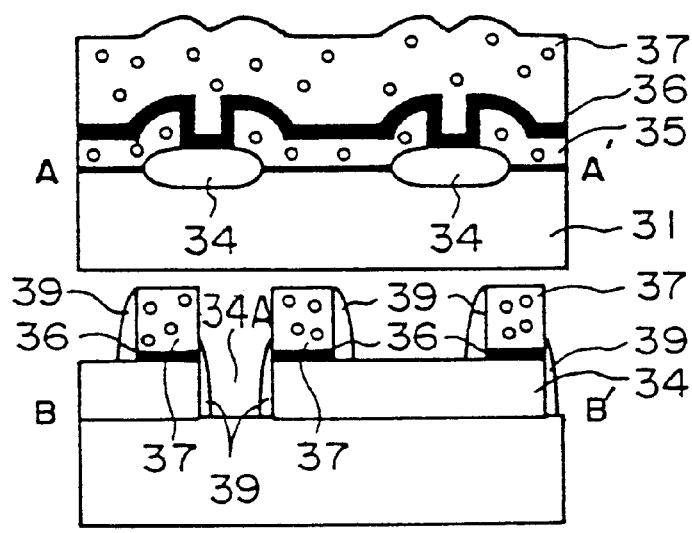
FIG. 18B
FIG. 18C
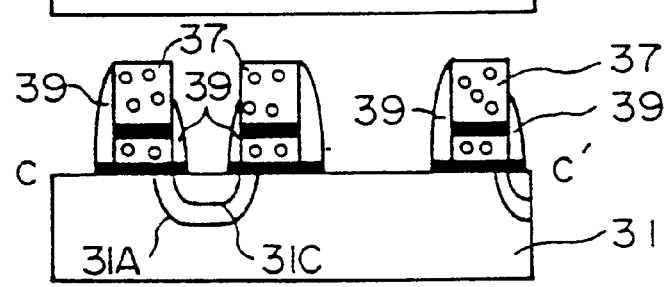
FIG. 18D

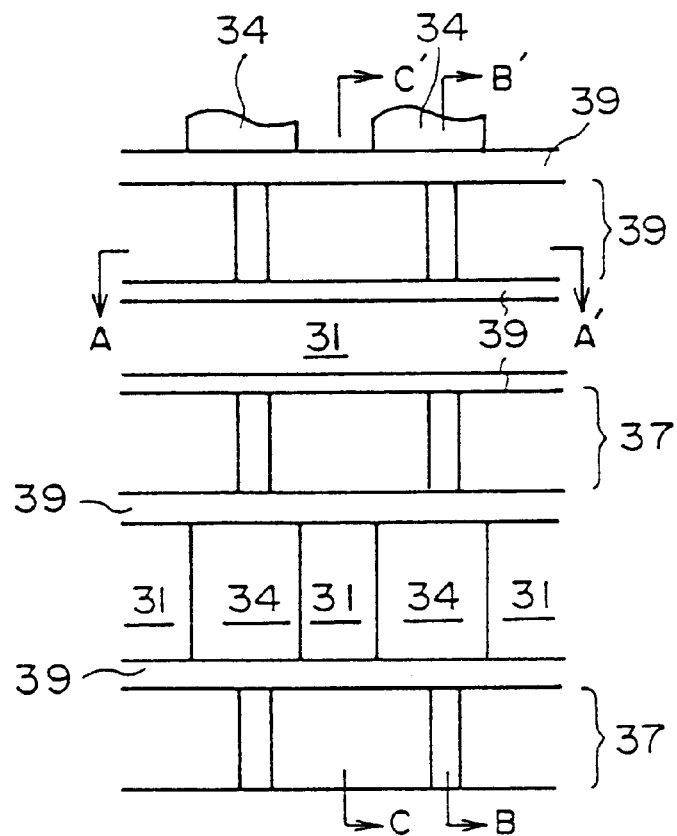
FIG. 19A
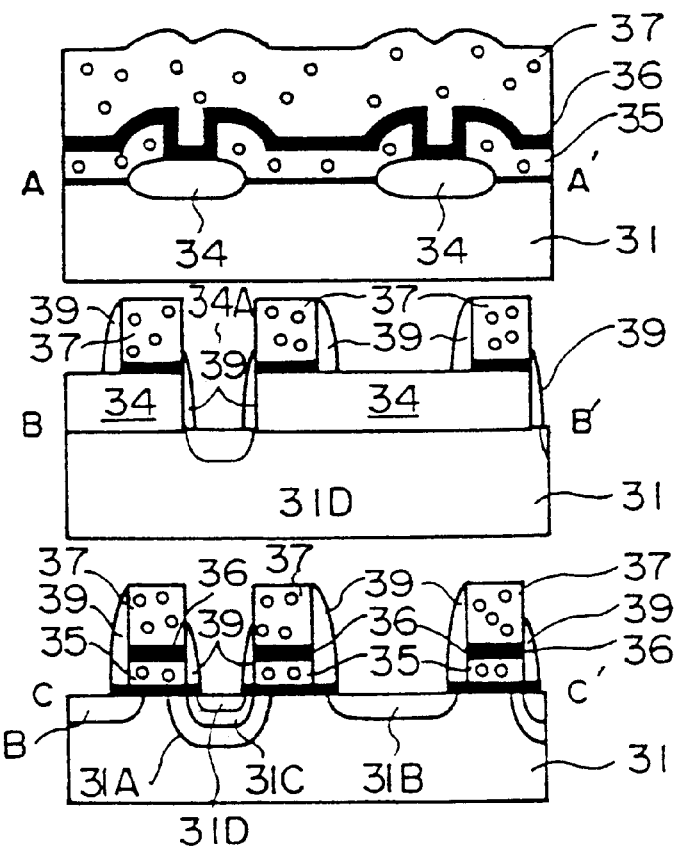
FIG. 19B
FIG. 19C
FIG. 19D

FLASH MEMORY DEVICE AND A FABRICATION PROCESS THEREOF

BACKGROUND OF THE INVENTION

The present invention generally relates to semiconductor devices and more particularly to a flash memory device and a fabrication process thereof.

A flash memory device is a non-volatile semiconductor memory device that stores information in a floating gate electrode in the form of electric charges. In a flash memory device, writing of information is made by injecting hot electrons, which are formed near a drain edge of a memory cell transistor, into the floating gate electrode via a tunneling oxide film. Further, erasing of the information is made by pulling out the electrons from the floating gate electrode. It should be noted that the electrons accumulated in the floating gate electrode control the conduction of the channel region of the memory cell transistor, and thus, the detection of the binary information stored in the floating gate electrode is carried out by detecting the conduction or non-conduction of the channel region of the memory cell transistor. In the case of a NOR-type flash memory, a flash erasing of information is achieved by pulling out the electric charges accumulated in the floating gate electrode to a source region of the memory cell transistor.

FIGS. 1A–1D, FIGS. 2A–2D, FIGS. 3A–3D, FIGS. 4A–4D, FIGS. 5A–5D, FIGS. 6A–6D, FIGS. 7A–7D, FIGS. 8A–8D and FIGS. 9A–9D show the fabrication process of a conventional NOR-type flash memory device, wherein FIGS. 1A–9A show the flash memory device of various fabrication steps in a plan view, FIGS. 1B–9B show the flash memory device of various fabrication steps in a cross-sectional view along a line A–A' of the plan view; FIGS. 1C–9C show the flash memory device of various fabrication steps in a cross-sectional view along a line B–B' of the plan view; and FIGS. 1D–9D show the flash memory device of various fabrication steps in a cross-sectional view along a line C–C' of the plan view.

Referring to FIGS. 1A–1D showing a first step, a p-type Si substrate 11 is covered by a pad oxide film 12 formed by a thermal oxidation process of the Si substrate 11 with a thickness of 15–30 nm, and a SiN film 13 is formed further thereon with a thickness of 150–200 nm. The SiN film 13 is patterned in correspondence to band-shaped device isolation regions by an etching process, and a band-shaped field oxide pattern 14 is formed in correspondence to the device isolation region by a wet oxidation process of the exposed Si substrate surface.

Next, in the step of FIGS. 2A–2D, the SiN film 13 and the underlying pad oxide film 12 are removed and an $SiO_2$ film 12A is formed on the exposed surface of the Si substrate 11 by a thermal oxidation process conducted in HCl, wherein the $SiO_2$ film 12A serves for a tunneling oxide film of the flash memory device. After the formation of the tunneling oxide film 12A, a polysilicon film is deposited on the structure thus obtained as indicated in FIGS. 2B and 11C wherein the polysilicon film is patterned to form a band-shaped polysilicon floating gate electrode 15 such that the floating gate electrode 15 covers the tunneling oxide film 12 exposed between a pair of the field oxide patterns 14.

Next, an interlayer insulation film 16 having an ONO structure is deposited in the step of FIGS. 3A–3D on the structure of FIGS. 2A–2D, by consecutively depositing a lower oxide film, an intermediate SiN film and an upper oxide film with respective thicknesses of about 7–10 nm, about 10–15 nm and about 3 nm. Further, a polysilicon film having a thickness of 150–200 nm and a WSi film having a thickness of 150–200 nm are deposited consecutively on the interlayer insulation film formed previously to form a conductor film 17, wherein the conductor film 17 thus formed is patterned, together with the underlying interlayer insulation film 16 and the polysilicon gate electrode 15 further below the interlayer insulation film 16, to form a gate structure such that the gate structure extends generally perpendicularly to the elongating direction of the field oxide patterns 14. The conductor pattern thus formed as a result of the patterning of the conductor film 17 serves for the control gate electrode of the flash memory device.

As a result of the patterning process of FIGS. 3A–3D, it should be noted that the polysilicon pattern 15 extending parallel to the field oxide patterns 14 is divided into individual, mutually isolated patterns. Further, it should be noted that the interlayer insulation film 16 forms an interlayer insulation pattern, as a result of the foregoing patterning process, such that the interlayer insulation pattern 16 extends parallel to the control gate electrode 17 underneath the control gate electrode 17. The interlayer insulation pattern 16 thereby covers the top surface and both lateral edge surfaces of each floating gate electrode pattern 15. See FIG. 3B.

As indicated in FIGS. 3A–3C, each control gate pattern 17 extends laterally across a plurality of field oxide patterns 14 and forms a word line WL of the flash memory device. Further, as can be seen in FIGS. 3B and 3D, the floating gate electrode pattern 15 is isolated from the Si substrate 11 by the tunneling oxide film 12A and further from the control gate electrode pattern 17 by the interlayer insulation pattern 16.

Next, in the step of FIGS. 4A–4D, a resist pattern 18 is formed so as to cover respective outer-halves of a pair of control gate electrode patterns 17, and an ion implantation process of $P^+$ is conducted into the Si substrate 11 in the step of FIGS. 5A–5D while using the resist pattern 18 and the control gate electrode pattern 17 as a mask., The ion implantation process is conducted typically under an acceleration voltage of 40–60 keV with a dose of about $10^{14} cm^{-2}$, and there is formed a source region 11A of the $n^{31}$ -type in the Si substrate 11 between a pair of adjacent control-gate electrode patterns 17 after a first thermal annealing process, which is conducted after the ion implantation process. In the step of FIGS. 5A–5D, it should be noted that no diffusion region is formed in correspondence to the drain region of the memory cell transistor, which drain region is to be formed between a pair of mutually adjacent control gate electrode patterns 17, as the drain region is protected by the resist pattern 18.

Next, in the step of FIGS. 6A–6D, the resist pattern 18 is removed and an ion implantation process of $As^+$ is conducted into the Si substrate 11 while using the control gate electrode pattern 17 as a self-aligned mask through the tunneling oxide film 12A, typically under an acceleration voltage of 40–60 keV and with a dose of about $10^{15} cm^{-2}$. After the ion implantation process, a second thermal annealing process is conducted to form a diffusion region 11B of the $n^+$-type in correspondence to the foregoing drain region. Thereby, a further diffusion region 11C of the $n^+$-type is formed inside the $n^-$-type source region 11A. As a result of the foregoing second thermal annealing process, the source region 11A of the $n^-$-type and the diffusion regions 11B and 11C of $n^+$-type experience a grow and invade into the region immediately underneath the floating gate electrode 15. After the formation of the $n^+$-type diffusion regions 11B and 11C, a side wall oxide film 19 is formed on the control gate electrode 17.

In the foregoing step of FIGS. 6A–6D, it should be noted that the source region 11A or 11C is separated from the neighboring source region 11A or 11C adjacent in the extending direction of the control gate electrode pattern 17, by an intervening field oxide film 14. Thus, the continuous source pattern, which is characteristic to a NOR-type flash memory device, is not yet formed in the step of FIGS. 6A–6D.

Thus, in the next step of FIGS. 7A–7D, a resist pattern 20 similar to the resist pattern 18 used in the step of FIGS. 4A–4D is provided on the structure of FIGS. 6A–6D, and a selective etching process is applied to an exposed part of the field oxide film 14 while using the resist pattern 20 and a part of the control gate electrode pattern 17 as a mask. As a result of the etching process, a groove 14A indicated in FIGS. 8A and 8C is formed such that the groove 14A extends continuously from the source region of a memory cell transistor where the diffusion region 11C is formed, to the diffusion region 11C forming the source region of an adjacent memory cell transistor. The groove 14A exposes the surface of the substrate 11.

Next, in the step of FIGS. 9A–9D, an ion implantation process of $As^+$ is conducted to the exposed surface of the Si substrate 11 exposed by the groove 14A, while using the control gate electrode pattern 17 as a self-aligned mask. Typically, the ion implantation of $As^+$ is conducted under an acceleration voltage of 40–60 keV with a dose of about $10^{15} cm^{-2}$. As a result of the ion implantation process, there is formed a continuous diffusion region 11D of the $n^+$-type in the substrate 11 as a source line such that the diffusion region 11D connects the $n^+$-type diffusion region of a memory cell transistor to the $n^+$-type diffusion region of an adjacent memory cell transistor.

Further, the structure of FIGS. 9A–9D is covered by an interlayer insulation film 21 in the step of FIG. 10A, and a contact hole 21A is formed in the interlayer insulation film 21 so as to expose the drain diffusion region 11B. Further, an Al pattern 22 extending in the direction generally perpendicular to the elongating direction of the control gate electrode 17 is deposited on the interlayer insulation film 21 so as to fill the contact hole 21A as a bit line BL. The Al pattern 22 thus formed is finally covered by another interlayer insulation film 23, and there is obtained a flash memory device having an equivalent circuit diagram of FIG. 10B in which the source regions 11A of the $n^-$-type are connected to an erasing power supply via the $n^+$-type diffusion regions 11C and the source lines 1D. In the flash memory of FIG. 10A, it should be noted that the control gate electrode 17 forms a word line WL of FIG. 10B.

In the flash memory of FIG. 10A, in which the foregoing $n^+$-type diffusion region 11C extends in the Si substrate 11 to the region immediately underneath the floating gate electrode pattern 15, the erasing of information is made reliably by causing the pulling out of the electrons from the floating gate electrode pattern 15 to the $n^+$-type diffusion region 11C across the tunneling oxide film 12A. Further, because of the fact that the diffusion region 11A is formed of a low-concentration $n^-$-type diffusion region, the electric field strength between the substrate 11 and the $n^+$-type diffusion region 11C is reduced, and the problem of excessive pulling-out of the electrons from the floating gate electrode 15 and associated injection of holes into the floating gate electrode pattern 15 is successfully avoided. As the drain region 11B is doped to the $n^+$-type, there occurs an efficient creation of hot electrons in the vicinity of the drain region 11B, and the injection of the electrons to the floating gate electrode pattern 15 occurs efficiently at the time of writing of information.

On the other hand, the NOR-type flash memory of the foregoing prior art has a drawback, in view of the fact that the ion implantation process is conducted three times, in the step of FIGS. 4A–4D, in the step of FIGS. 6A–6D and in the step of FIGS. 9A–9D, in that the diffusion region 11A may penetrate deeply into the channel region underneath the floating gate electrode 15, more than one-half the channel length of the memory cell transistor, as a result of the thermal annealing process associated to the ion implantation process. Similarly, there is a possibility that the diffusion region 11B penetrates deeply into the channel region underneath the floating gate electrode pattern 15 in view of the ion implantation process and the thermal annealing process conducted twice, in the step of FIGS. 6A–6D and in the step of FIGS. 9A–9D.

Thus, such a conventional NOR-type flash memory device may suffer from the problem of short-channel effect due to the excessive reduction of the effective gate length. This problem of short-channel effect becomes particularly serious in a highly miniaturized flash memory device.

SUMMARY OF THE INVENTION

Accordingly, it is a general object of the present invention to provide a novel and useful flash memory device and a fabrication process thereof wherein the foregoing problems are eliminated.

Another and more specific object of the present invention is to provide a semiconductor device having a floating gate electrode and a source diffusion region connected to a diffusion region that forms a source line, wherein the electrons can be pulled out reliably from the floating gate electrode to the source region through a tunneling insulation film.

Another object of the present invention is to provide a semiconductor device having a floating gate electrode and a source diffusion region connected to a diffusion region that forms a source line, wherein injection of hot electrons into the floating gate electrode can be made efficiently by securing a sufficient impurity concentration level for the drain diffusion region.

Another object of the present invention is to provide a semiconductor device having a floating gate electrode and a source diffusion region connected to a diffusion region that forms a source line, wherein the problem of deep penetration of a drain diffusion region into a channel region is suppressed effectively.

Another object of the present invention is to provide a fabrication process of a semiconductor device, said semiconductor device comprising: a substrate carrying a field insulation film thereon; a tunneling insulation film formed on said substrate so as to cover an active region defined by said field insulation film; and a gate structure provided on said tunneling insulation film and including a floating gate electrode formed on said tunneling insulation film, an interlayer insulation film provided on said floating gate electrode and a control electrode formed on said interlayer insulation film, said method comprising the steps of:

forming a first diffusion region in said active region by conducting a first ion implantation process at a first side of said gate structure;

exposing, after said step of forming said first diffusion region, a surface of said substrate outside said active region by removing a part of said field insulation film adjacent to said first diffusion region;

forming a second diffusion region in said active region by conducting a second ion implantation process as a second, opposite side of said gate structure; and forming a third diffusion region adjacent to said first diffusion region by conducting a third ion implantation process to said exposed surface of said substrate, said second ion implantation process and said third ion implantation process being conducted concurrently.

Another object of the present invention is to provide a semiconductor device, comprising:

a substrate;

a field insulation film formed on said substrate so as to define an active region;

a gate structure formed on said active region of said substrate, said gate structure including a tunneling insulation film covering said active region, a floating gate electrode provided on said tunneling insulation film, an interlayer insulation film provided on said floating gate electrode, and a control electrode provided on said interlayer insulation film, said gate structure further including a first side wall insulation film on a first side wall of said gate structure and a second side wall insulation film on a second side wall of said gate structure;

a first diffusion region formed in said active region of said substrate at a first side of said gate structure, said first diffusion region including an inner region and an outer region surrounding said inner region, said outer region having an impurity concentration level lower than an impurity concentration level of said inner region;

a second diffusion region formed in said active region of said substrate at a second, opposite side of said gate structure, said second diffusion region having a conductivity type identical with a conductivity type of said first diffusion region;

a groove formed in said field insulation film adjacent to said inner region of said first diffusion region, said groove exposing a surface of said substrate; and a third diffusion region formed in said surface of said substrate exposed by said groove, in continuation with said inner region of said first diffusion region, said third diffusion region having a conductivity type identical with said conductivity type of said first and second diffusion regions, wherein said second diffusion region and said third diffusion region contain a common impurity element with an identical concentration level.

According to the memory cell transistor of the NOR-type flash memory device of the present invention in which the first and second diffusion regions are provided respectively as the source and drain regions of the memory cell transistor and in which the first diffusion region is connected to the third diffusion region acting as a source line, the second diffusion region is formed after the step of forming the first diffusion region with a timing simultaneously to the step of forming the third diffusion region. By doing so, it is possible to avoid unnecessary thermal annealing process applied to the second diffusion region when forming the third diffusion region, and the problem of unwanted invasion of the impurity element from the second diffusion region to the channel region right underneath the gate structure is successfully avoided. Thereby, the problem of short channel effect is successfully avoided even when the flash memory device is miniaturized. Further, the semiconductor device of the present invention has an advantageous feature of simple fabrication process due to the self-aligned formation of the drain region and the source line.

Other objects and further features of the present invention will become apparent from the following detailed description when read in conjunction with the attached drawings.

BRIEF DESCRIPTION OF THE DRAWINGS

FIGS. 2A–2D are diagrams showing a second fabrication step of the conventional flash memory device respectively in a plan view, a first cross-sectional view, a second cross-sectional view and a third cross-sectional view;

FIGS. 5A–5D are diagrams showing a fifth fabrication step of the conventional flash memory device respectively in a plan view, a first cross-sectional view, a second cross-sectional view and a third cross-sectional view;

FIGS. 15A–15D are diagrams showing a fifth fabrication step of the flash memory device of the present invention respectively in a plan view, a first cross-sectional view, a second cross-sectional view and a third cross-sectional view;

FIGS. 16A–16D are diagrams showing a sixth fabrication step of the flash memory device of the present invention respectively in a plan view, a first cross-sectional view, a second cross-sectional view and a third cross-sectional view;

FIGS. 18A–18D are diagrams showing an eighth fabrication step of the flash memory device of the present invention respectively in a plan view, a first cross-sectional view, a second cross-sectional view and a third cross-sectional view;

FIGS. 19A–19D are diagrams showing a ninth fabrication step of the flash memory device of the present invention respectively in a plan view, a first cross-sectional view, a second cross-sectional view and a third cross-sectional view.

DETAILED DESCRIPTION OF THE PREFERRED EMBODIMENTS

FIGS. 11A–11D, FIGS. 12A–12D, FIGS. 13A–13D, FIGS. 14A–14D, FIGS. 15A–15D, FIGS. 16A–16D, FIGS. 17A–17D, FIGS. 18A–18D and FIGS. 19A–19D show the fabrication process of a NOR-type flash memory device according to an embodiment of the present invention, wherein FIGS. 11A–19A show the flash memory device of various fabrication steps in a plan view, FIGS. 11B–19B show the flash memory device of various fabrication steps in a cross-sectional view along a line A–A' of the plan view; FIGS. 11C–19C show the flash memory device of various fabrication steps in a cross-sectional view along a line B–B' of the plan view; and FIGS. 11D–19D show the flash memory device of various fabrication steps in a cross-sectional view along a line C–C' of the plan view.

Referring to FIGS. 11A–11D showing a first step, a p-type Si substrate 31 is covered by a pad oxide film 32 formed by a thermal oxidation process of the Si substrate 31 with a thickness of 15–30 nm, and a SiN film 33 is formed further thereon with a thickness of 150–200 nm. The SiN film 33 is patterned in correspondence to band-shaped device isolation regions by an etching-process, and a band-shaped field oxide pattern 34 is formed in correspondence to the device isolation region by a wet oxidation process of the exposed Si substrate surface.

Figure 12A:
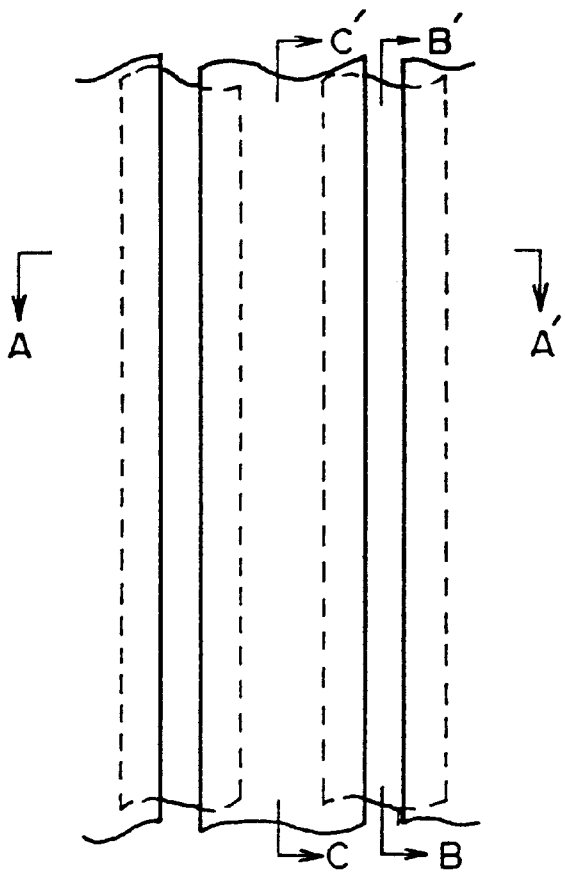
FIGS. 12A–12D are diagrams showing a second fabrication step of the flash memory device of the present invention respectively in a plan view, a first cross-sectional view, a second cross-sectional view and a third cross-sectional view.
Figure 12B:
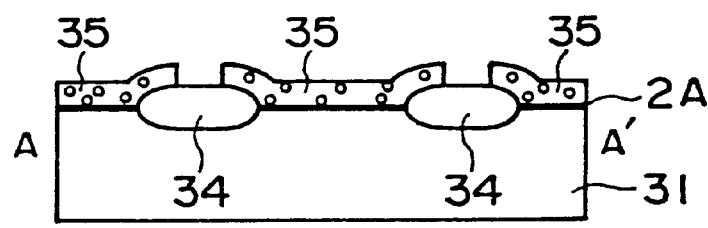
Figure 12C:
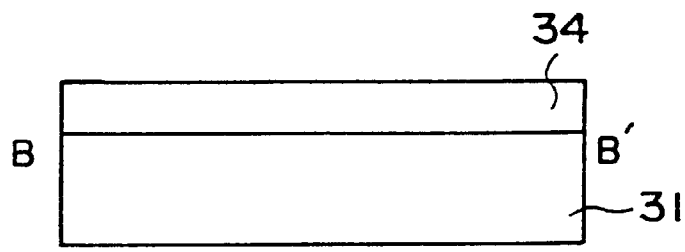
Figure 12D:
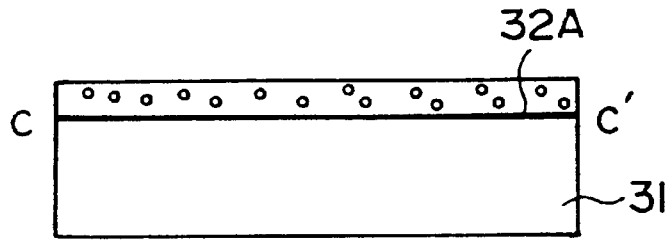

Next, in the step of FIGS. 12A–12D, the SiN film 33 and the underlying pad oxide film 32 are removed and an $SiO_2$ film 32A is formed on the exposed surface of the Si substrate 31 by a thermal oxidation process conducted in HCl, wherein the $SiO_2$ film 32A serves for a tunneling oxide film of the flash memory device. After the formation of the tunneling oxide film 32A, a polysilicon film is deposited on the structure thus obtained as indicated in FIGS. 12B and 12D wherein the polysilicon film is patterned to form a band-shaped polysilicon floating gate electrode 35 such that the floating gate electrode 35 covers the tunneling oxide film 32A exposed between a pair of the field oxide patterns 34.

Next, an interlayer insulation film 36 having an ONO structure is deposited in the step of FIGS. 13A–13D on the structure of FIGS. 12A–12D, by consecutively depositing a lower oxide film, an intermediate SiN film and an upper oxide film with respective thicknesses of about 7–10 nm, about 10–15 nm and about 3 nm. Further, a polysilicon film having a thickness of 150–200 nm and a WSi film having a thickness of 150–200 nm are deposited consecutively on the interlayer insulation film formed previously to form a conductor film 37, wherein the conductor film 37 thus formed is patterned, together with the underlying interlayer insulation film 36 and the polysilicon gate electrode 35 further below the interlayer insulation film 36, to form a gate structure such that the gate structure extends generally perpendicularly to the elongating direction of the field oxide patterns 34. The conductor pattern thus formed as a result of the patterning of the conductor film 37 serves for the control gate electrode of the flash memory device.

As a result of the patterning process of FIGS. 13A–13D, it should be noted that the polysilicon pattern 35 extending parallel to the field oxide patterns 34 is divided into individual, mutually isolated patterns. Further, it should be noted that the interlayer insulation film 36 forms an interlayer insulation pattern, as a result of the foregoing patterning process, such that the interlayer insulation pattern 36 extends parallel with the control gate electrode 37 underneath the control gate electrode 37. The interlayer insulation pattern 36 thereby covers the top surface and both lateral edge surfaces of each floating gate electrode pattern 35. See FIG. 13B.

Figure 13A:
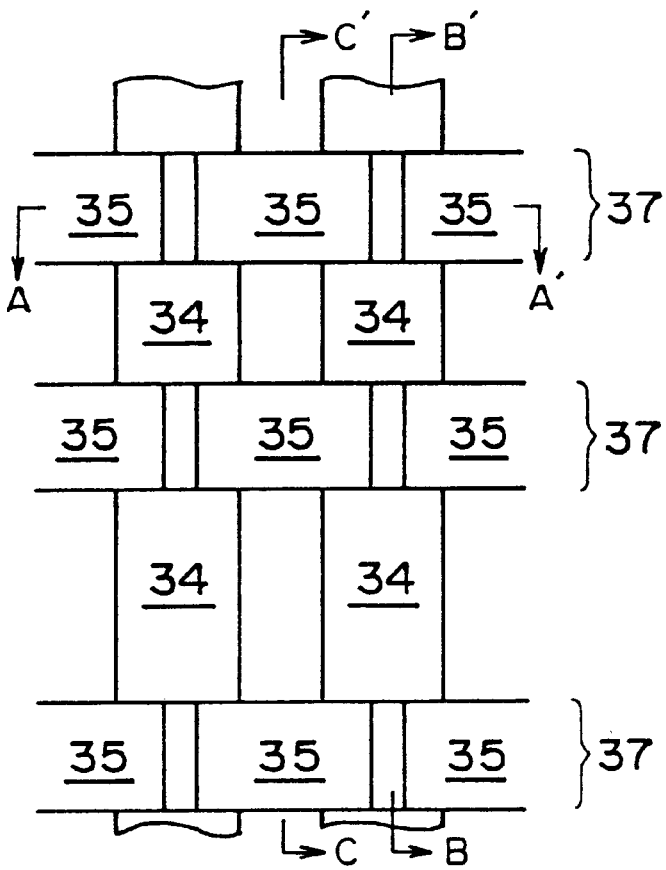
FIGS. 13A–13D are diagrams showing a third fabrication step of the flash memory device of the present invention respectively in a plan view, a first cross-sectional view, a second cross-sectional view and a third cross-sectional view.
Figure 13B:
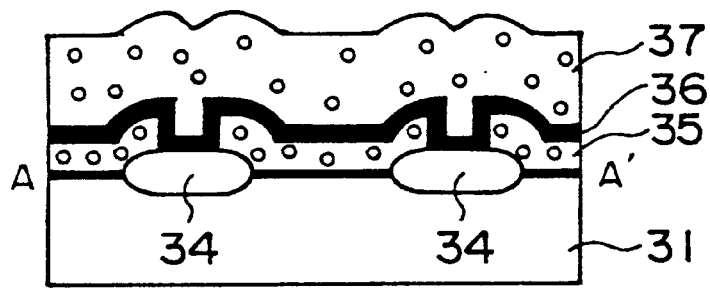
Figure 13C:
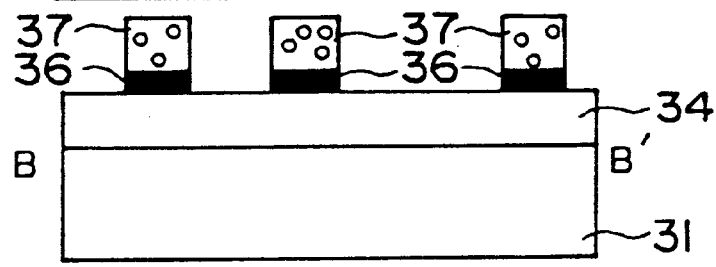
Figure 13D:
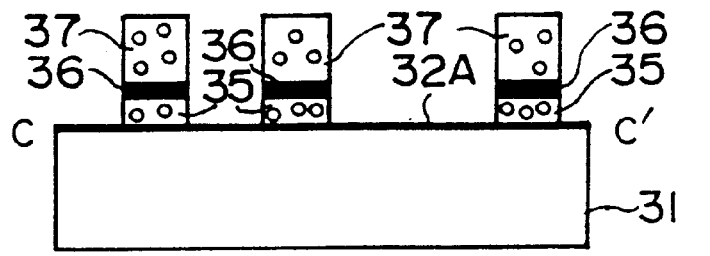
Figure 14A:
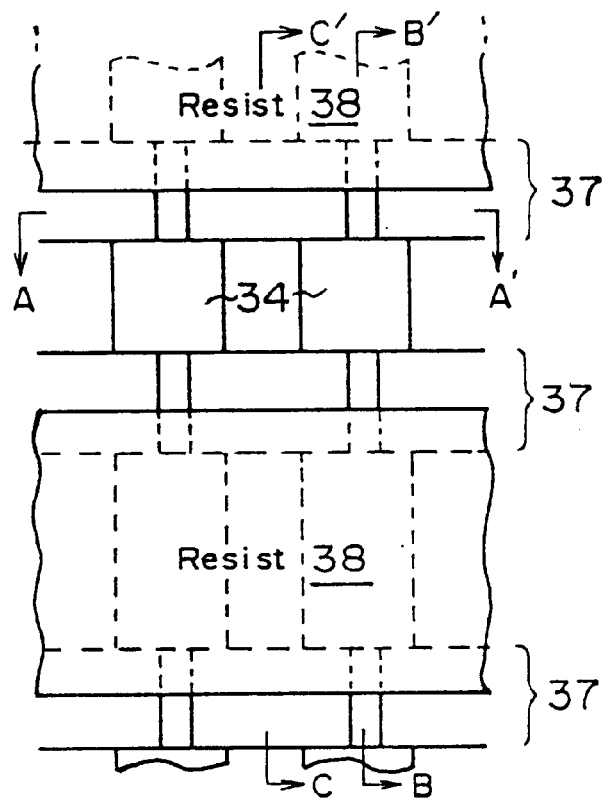
FIGS. 14A–14D are diagrams showing a fourth fabrication step of the flash memory device of the present invention respectively in a plan view, a first cross-sectional view, a second cross-sectional view and a third cross-sectional view.
Figure 14B:
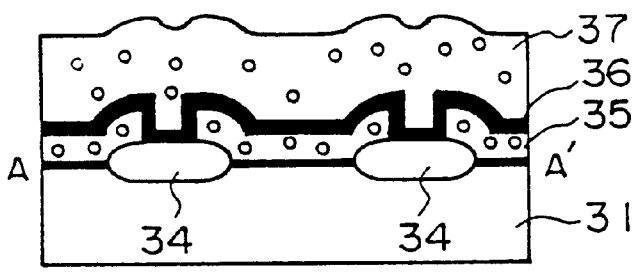
Figure 14C:
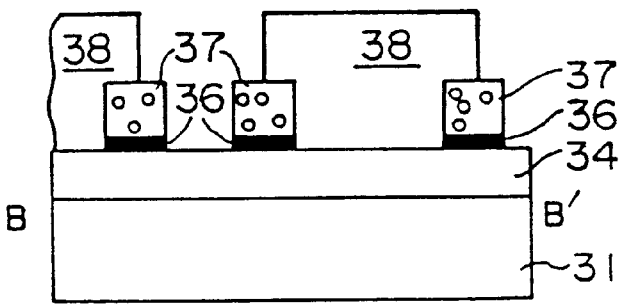
Figure 14D:
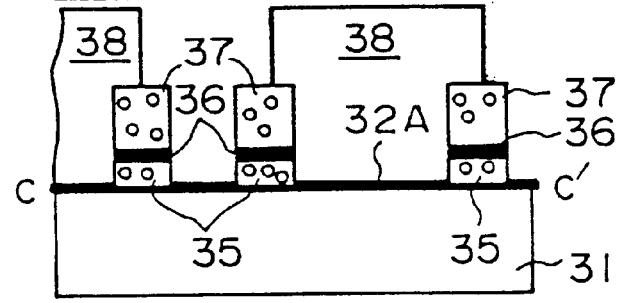
Figure 17A:
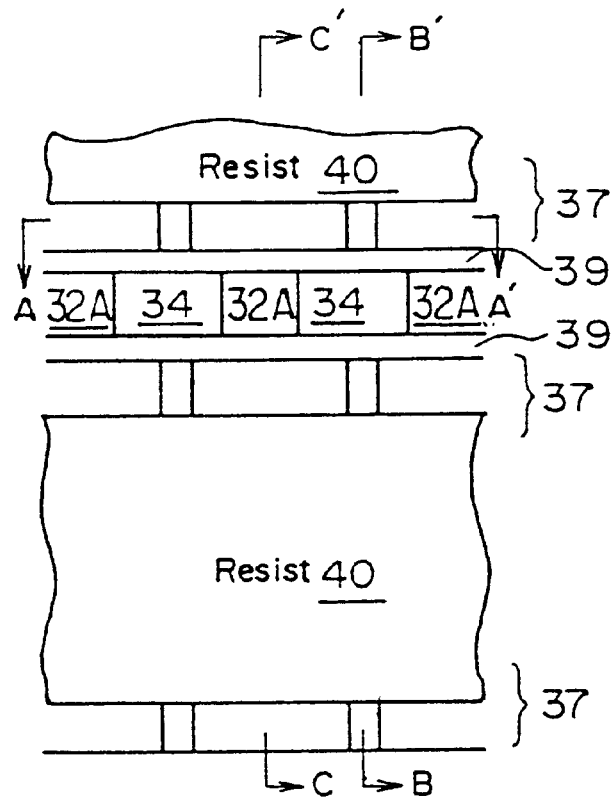
FIGS. 17A–17D are diagrams showing a seventh fabrication step of the flash memory device of the present invention respectively in a plan view, a first cross-sectional view, a second cross-sectional view and a third cross-sectional view.
Figure 17B:
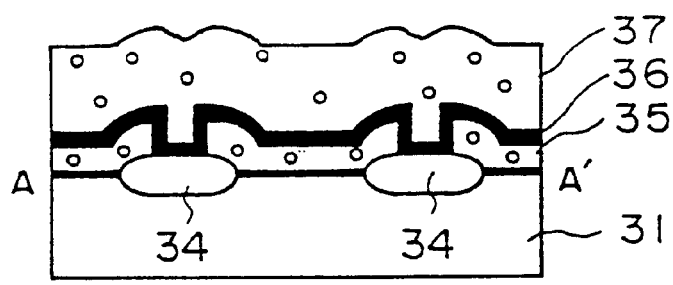
Figure 17C:
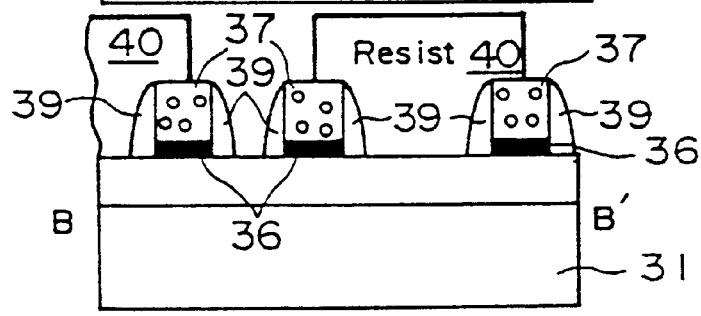
Figure 17D:
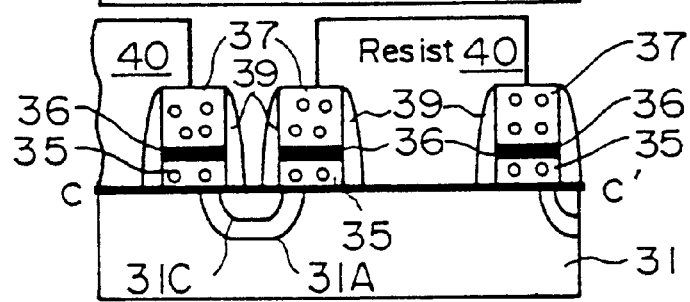

As indicated in FIGS. 13A–13C, each control gate pattern 37 extends laterally across a plurality of field oxide patterns 34 and.forms a word line WL of the flash memory device. Further, as can be seen in FIGS. 13B and 13D, the floating gate electrode pattern 35 is isolated from the Si substrate 31 by the tunneling oxide film 32A and further from the control gate electrode pattern 37 by the interlayer insulation pattern 36.

Next, in the step of FIGS. 14A–14D, a resist pattern 38 is formed so as to cover respective outer-halves of a pair of control gate electrode patterns 37, and an ion implantation process of $P^+$ is conducted into the Si substrate 31 in the following step of FIGS. 15A–15D while using the resist pattern 38 and the control gate electrode pattern 37 as a mask. The ion implantation process is conducted typically under an acceleration voltage of 40–60 keV with a dose of about $10^{14} cm^{-2}$, and there is formed a source region 31A of the $n^-$-type in the Si substrate 11 between a pair of adjacent control gate electrode patterns 17 as a result of a first thermal annealing process conducted after the ion implantation process as indicated in FIG. 15D. In the step of FIGS. 15A–15D, it should be noted that no diffusion region is formed in correspondence to the drain region of the memory cell transistor, which drain region is to be formed between a pair of the mutually adjacent control gate electrode patterns 37, as the drain region is protected by the resist pattern 38.

In the step of FIGS. 15A–15D, it should be noted that a further ion implantation process of $As^+$ is carried out through the tunneling oxide film 12A, after the foregoing ion implantation process of $P^+$, while using a resist pattern similar to the resist pattern 38 and the control gate electrode pattern 17 as a mask, typically under an acceleration voltage of 40–60 keV and with a dose of about $10^{14} cm^{-2}$. As a result of the ion implantation process of $As^+$ and associated thermal annealing process conducted at about 900° C. a diffusion region 31C of the $n^+$-type is formed in the Si substrate 31 in an overlapping relation to the diffusion region 31A. In other words, the diffusion region 31C of the $n^+$-type is formed inside the $n^-$-type source region 31A. As a result of the thermal annealing process for forming the diffusion region 31C, the source region 31A of the $n^-$-type experiences a growth and invades into the region immediately underneath the floating gate electrode 35.

Next, in the step of FIGS. 16A–16D, a side wall oxide film 39 is formed on the control gate electrode 37, and a resist pattern 40 similar to the resist pattern 38 is formed in the step of FIGS. 17A–17D on the structure of FIGS. 16A–16D. Further, a step of FIGS. 18A–18D is conducted, in which an exposed part of the interlayer insulation film 34 is selectively removed by a dry etching process while using the resist pattern 40 and the control gate electrode pattern 37 as a mask. As a result of the dry etching process of FIGS. 18A–18D, a groove 34A is formed in the interlayer insulation film 34 as indicated in FIGS. 18A and 18C such that the groove 34A connects the diffusion region 31C of a memory cell transistor to the diffusion region 31C of an adjacent memory cell transistor. The dry etching process is typically conducted by using $CHF_3$ such that the dry etching process stops spontaneously upon the exposure of the Si substrate surface.

Next, in the step of FIGS. 19A–19D, an ion implantation process of $As^+$ is conducted to the exposed surface of the Si substrate 31 exposed by the groove 34A, while using the control gate electrode pattern 37 as a self-aligned mask. Typically, the ion implantation of $As^+$ is conducted under an acceleration voltage of 40–60 keV with a dose of about $10^{14} cm^{-2}$. As a result of the ion implantation process, there is formed a continuous diffusion region 31D of the $n^+$-type in the substrate 31 as a source line such that the diffusion region 31D connects the $n^+$-type diffusion region of a memory cell transistor to a corresponding $n^+$-type diffusion region of an adjacent memory cell transistor.

Simultaneously to the formation of the diffusion region 31D, a further diffusion region 31B of the $n^+$-type is formed in the Si substrate 31 at the other side of the control gate electrode 37 as a drain region of the memory cell transistor, wherein the diffusion region 31B contains As with a concentration level substantially identical to the concentration level in the diffusion region 31D.

In the step of FIGS. 19A–19D, it should be noted that the doping of $As^+$ is conducted also to the diffusion region 31C that has been formed previously as a result of the doping of $As^+$. Thereby, the As concentration level of the diffusion region 31C becomes inevitably higher than the As concentration level of the drain region 31B or the source line 31D.

Figure 1A:
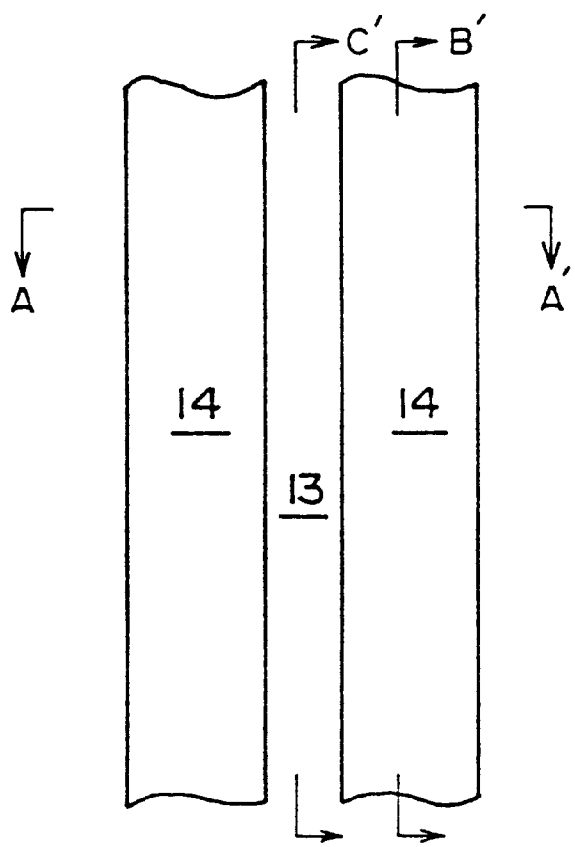
FIGS. 1A–1D are diagrams showing a first fabrication step of a conventional flash memory device respectively in a plan view, a first cross-sectional view, a second cross-sectional view and a third cross-sectional view.
Figure 1B:
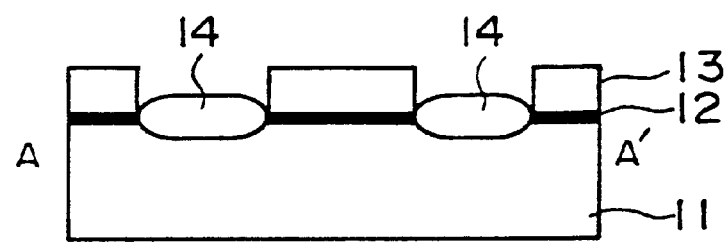
Figure 1C:
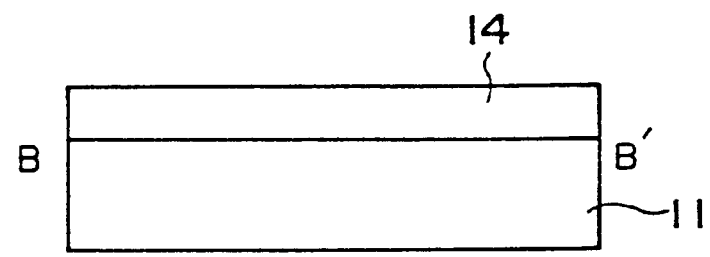
Figure 1D:
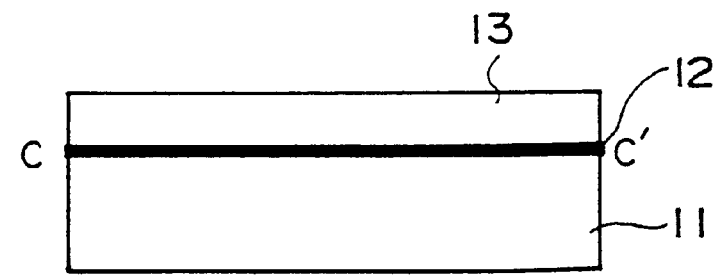
Figure 3A:
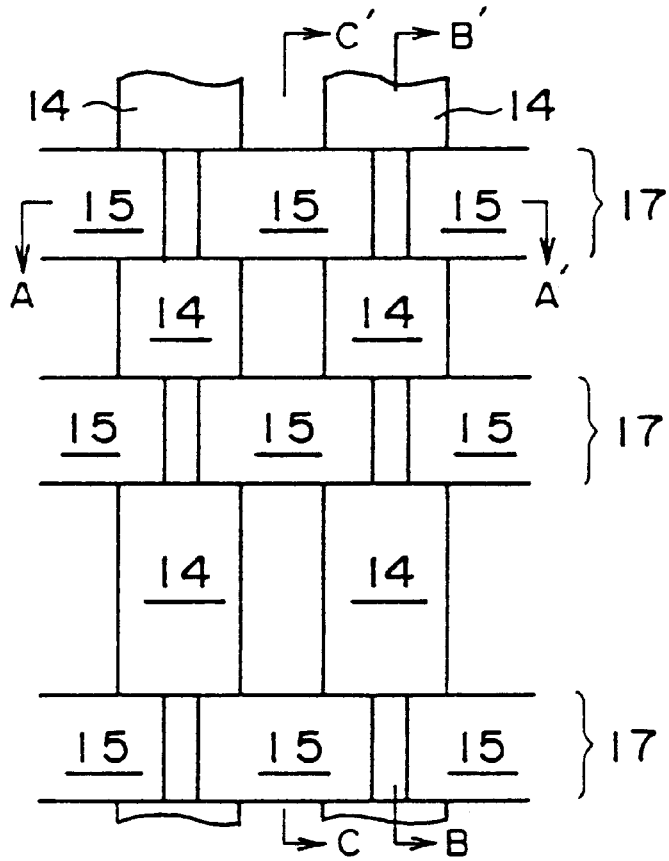
FIGS. 3A–3D are diagrams showing a third fabrication step of the conventional flash memory device respectively in a plan view, a first cross-sectional view, a second cross-sectional view and a third cross-sectional view.
Figure 3B:
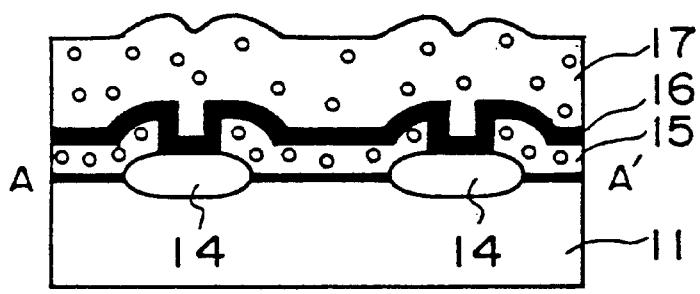
Figure 3C:
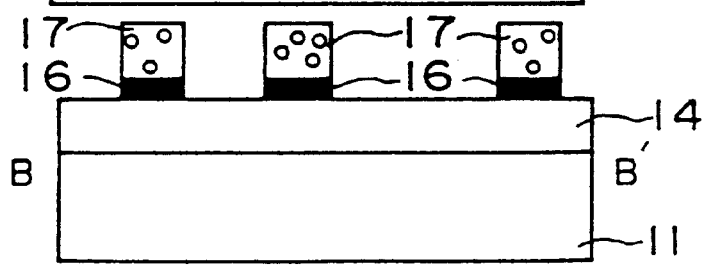
Figure 3D:
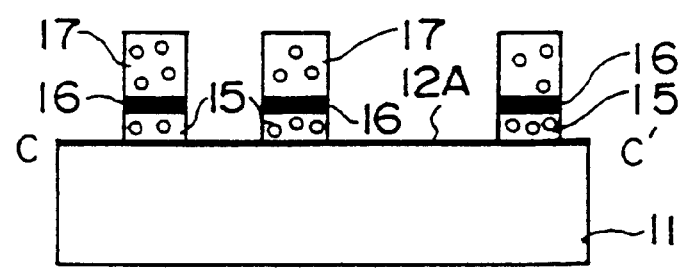
Figure 4A:
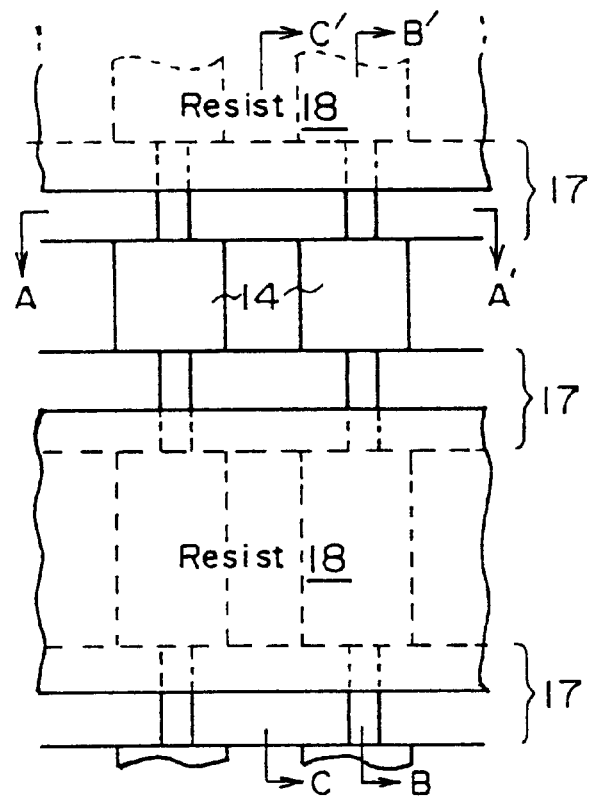
FIGS. 4A–4D are diagrams showing a fourth fabrication step of the conventional flash memory device respectively in a plan view, a first cross-sectional view, a second cross-sectional view and a third cross-sectional view.
Figure 4B:
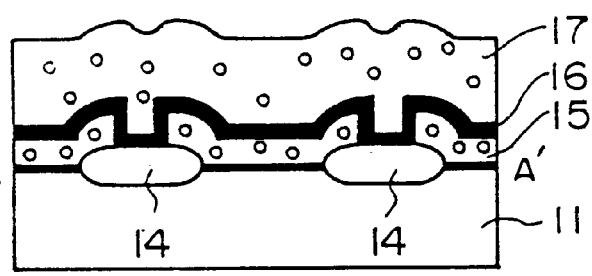
Figure 4C:
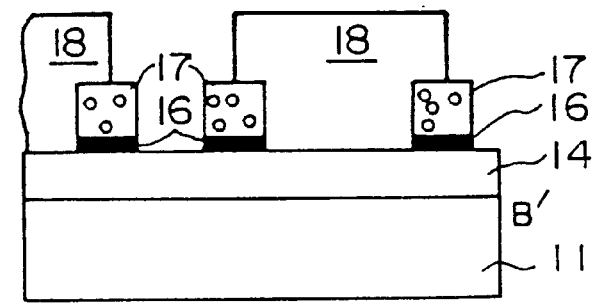
Figure 4D:
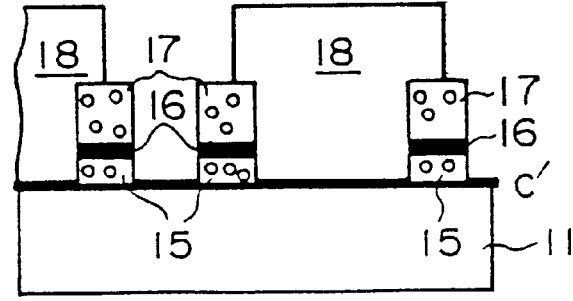
Figure 6A:
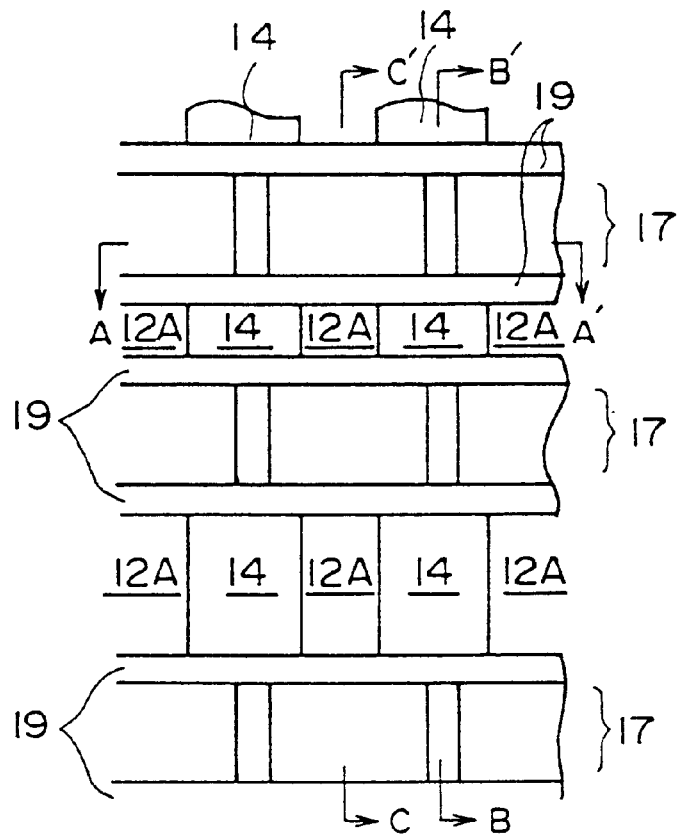
FIGS. 6A–6D are diagrams showing a sixth fabrication step of the conventional flash memory device respectively in a plan view, a first cross-sectional view, a second cross-sectional view and a third cross-sectional view.
Figure 6B:
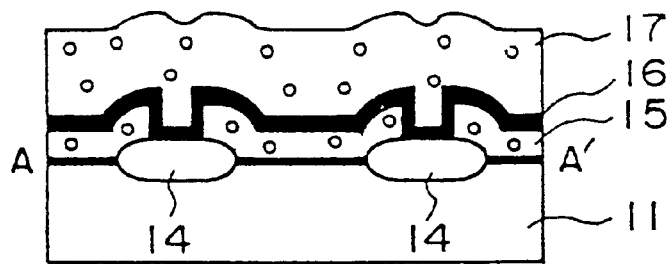
Figure 6C:
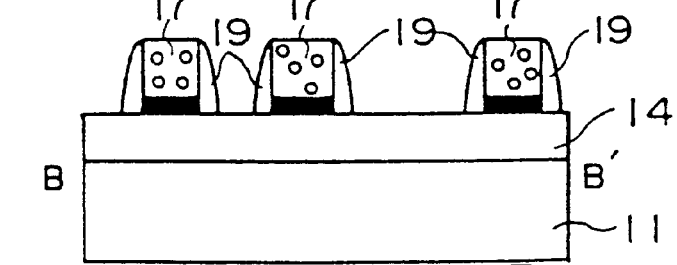
Figure 6D:
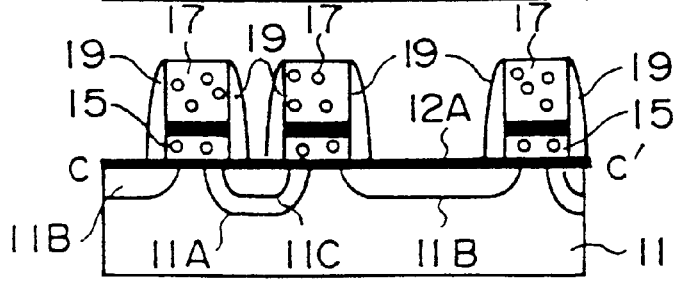
Figure 7A:
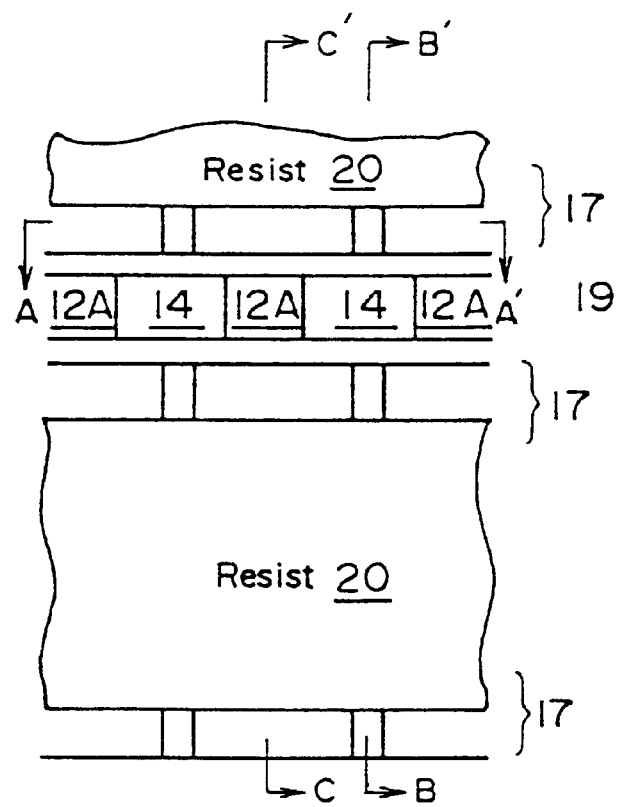
FIGS. 7A–7D are diagrams showing a seventh fabrication step of the conventional flash memory device respectively in a plan view, a first cross-sectional view, a second cross-sectional view and a third cross-sectional view.
Figure 7B:
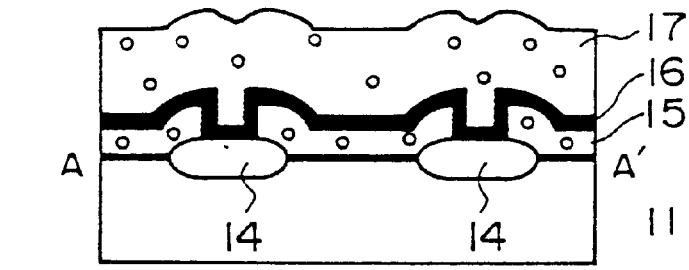
Figure 7C:
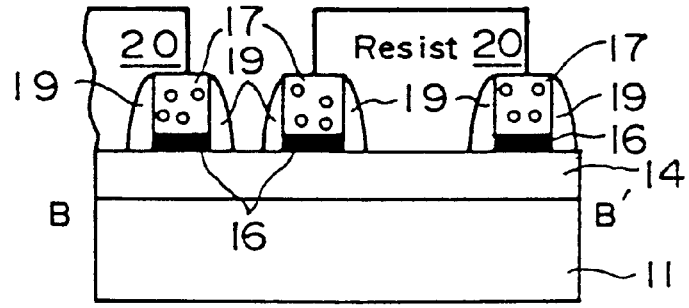
Figure 7D:
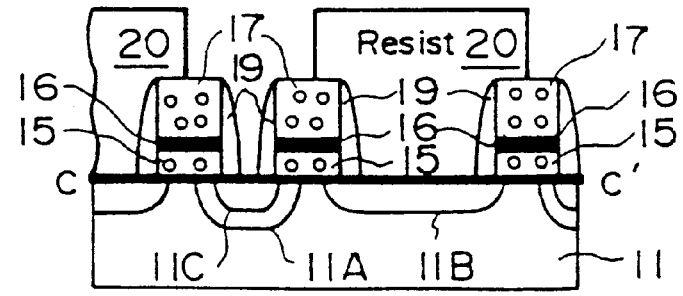
Figure 8A:
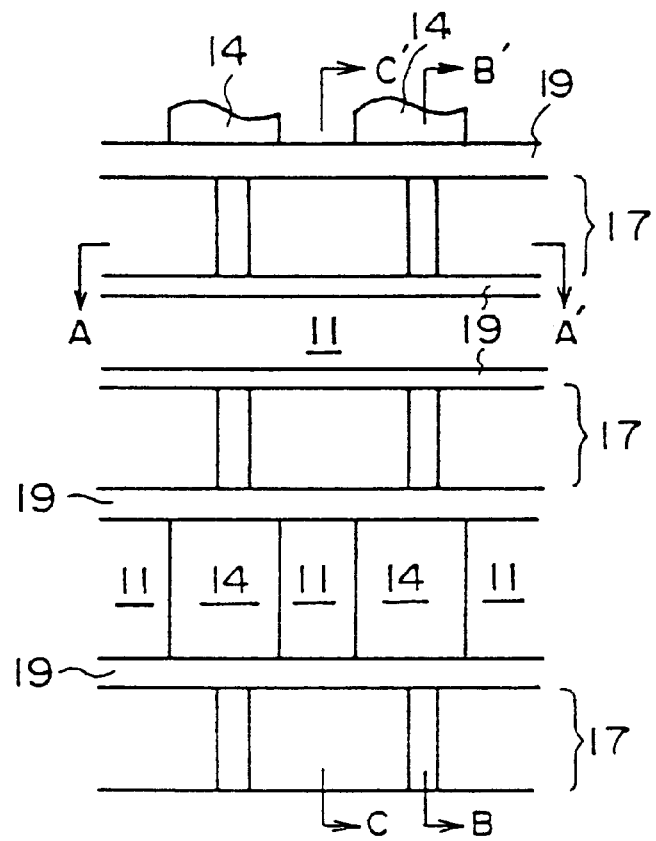
FIGS. 8A–8D are diagrams showing an eighth fabrication step of the conventional flash memory device respectively in a plan view, a first cross-sectional view, a second cross-sectional view and a third cross-sectional view.
Figure 8B:
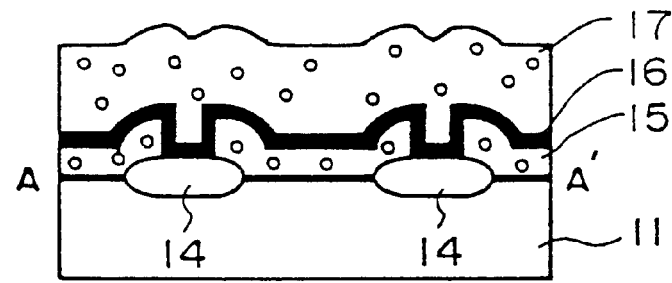
Figure 8C:
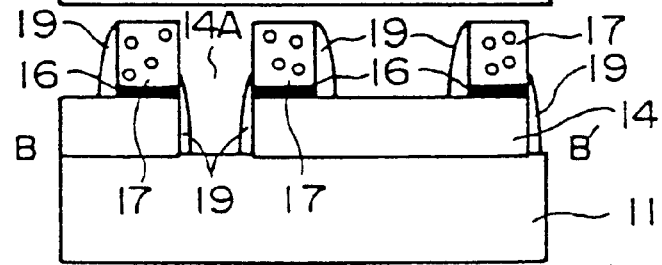
Figure 8D:
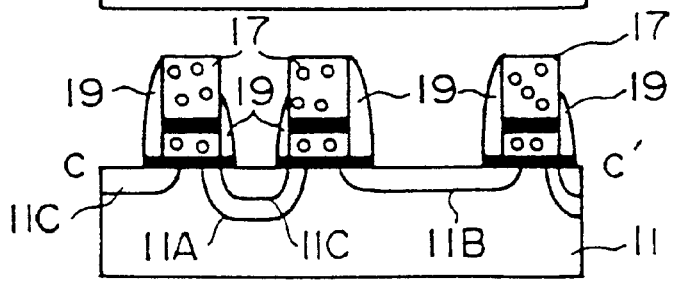
Figure 9A:
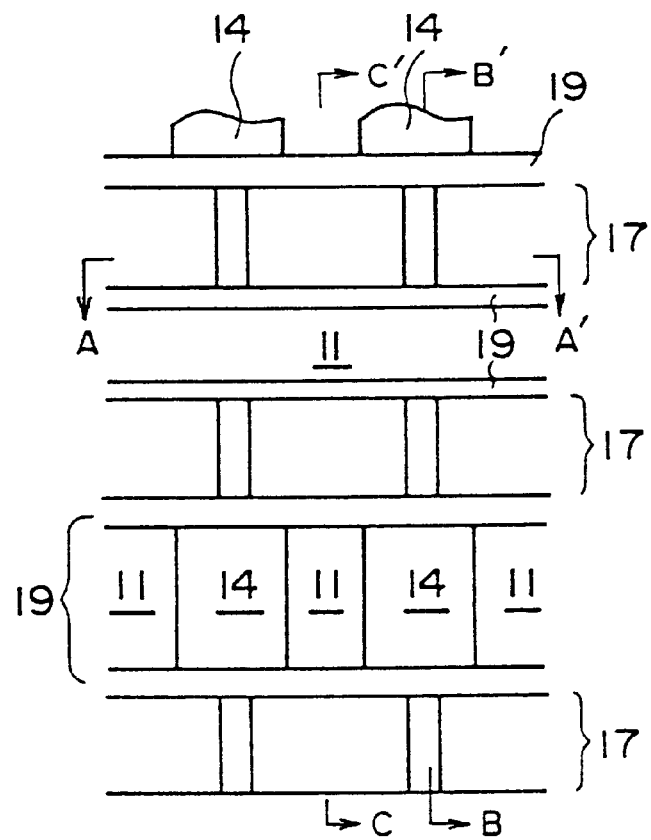
FIGS. 9A–9D are diagrams showing a ninth fabrication step of the conventional flash memory device respectively in a plan view, a first cross-sectional view, a second cross-sectional view and a third cross-sectional view.
Figure 9B:
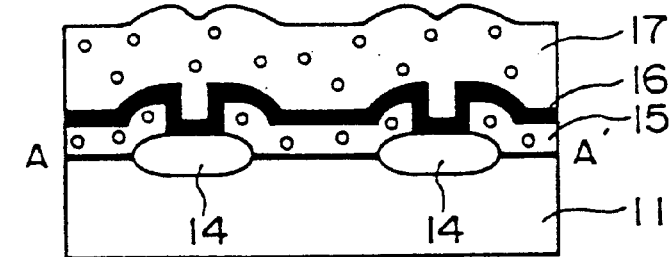
Figure 9C:
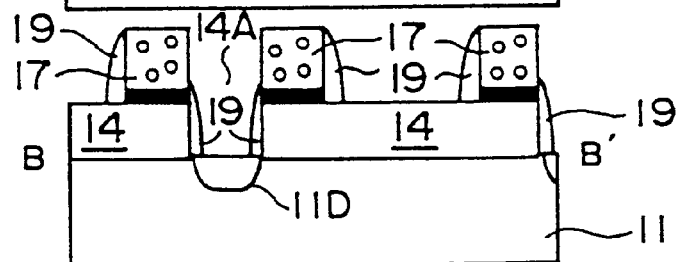
Figure 9D:
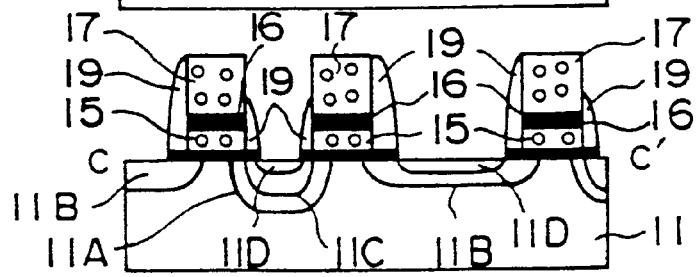
Figure 10A:
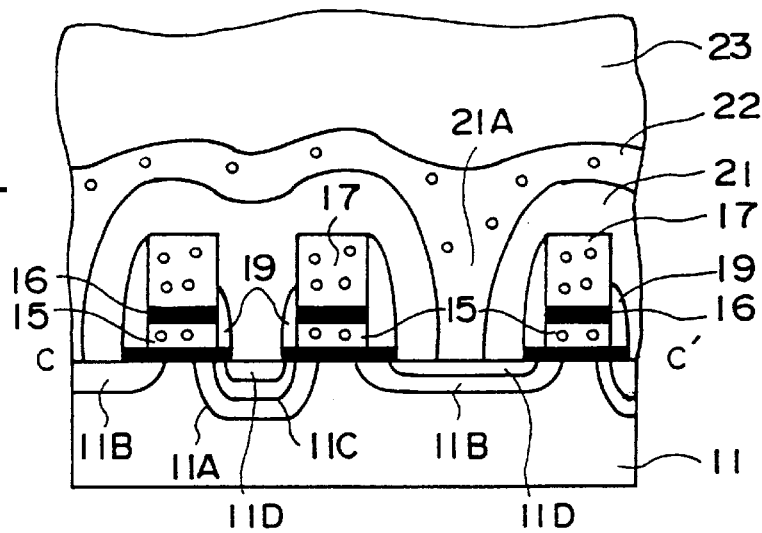
FIGS. 10A and 10B are diagrams showing the construction of a conventional flash memory device and an equivalent circuit thereof.
Figure 10B:
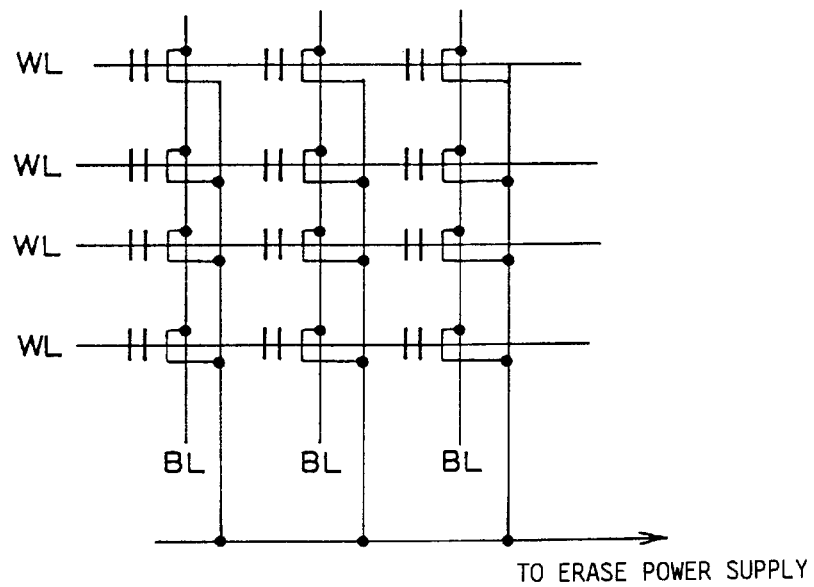
Figure 11A:
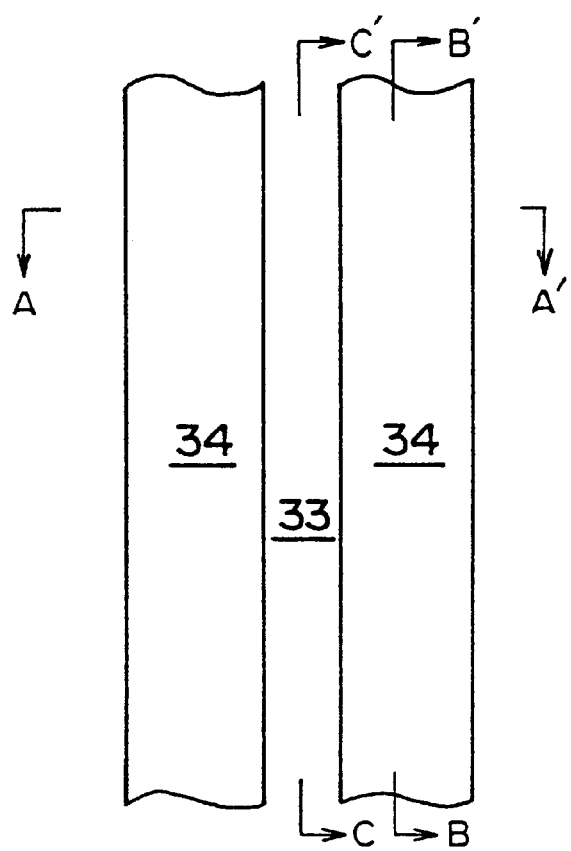
FIGS. 11A–11D are diagrams showing a first fabrication step of a flash memory device according to an embodiment of the present invention respectively in a plan view, a first cross-sectional view, a second cross-sectional view and a third cross-sectional view.
Figure 11B:
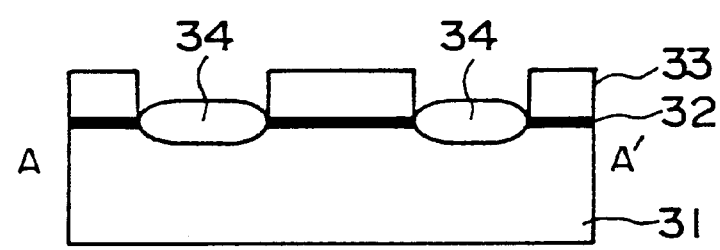
Figure 11C:
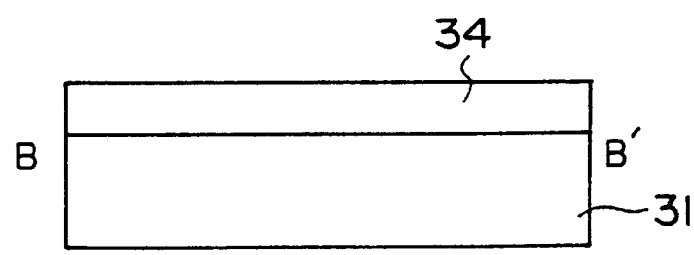
Figure 11D:
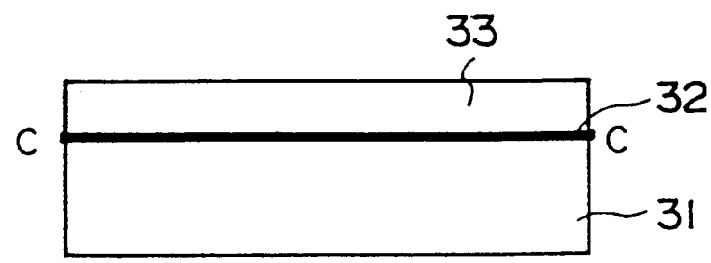

After the step of FIGS. 19A–19D, a step similar to the step of FIG. 10A is conducted. Thus, the structure of FIGS. 19A–19D is covered by the interlayer insulation film 21 and the contact hole 21A is formed in the interlayer insulation film 21 so as to expose the drain region 31B of the memory cell transistor. Further, the Al pattern 22 is formed as a bit line BL so as to fill the contact hole 21A such that the Al pattern 22 extends generally perpendicularly to the elongating direction of the control gate electrode 37. The control gate electrode 37 is further covered by the interlayer insulation film 23. As a result, a flash memory device having an equivalent circuit diagram shown in FIG. 10B is obtained such that the $n^-$-type source region 31A is connected to an erasing power supply via the $n^+$-type diffusion region 31C and the source line 31D of the $n^+$-type.

According to the flash memory device of the present invention, the source region 31A of the $n^-$-type and the diffusion region 31C of the $n^+$-type therein extend in the Si substrate 31 to the channel region right underneath the floating gate electrode pattern 35, and the erasing of information is achieved reliably as a result of the tunneling of electrons from the floating gate electrode pattern 35 to the $n^+$-type diffusion region 31C through the tunneling oxide film 32A. As the source region 31A itself is a low-concentration $n^-$-type diffusion region, the electric field strength between the substrate 31 and the $n^+$-type diffusion region 31C is reduced and the problem of excessive pulling-out of the electrons from the floating gate electrode 35 and associated injection of holes is effectively eliminated. As the drain region 31B is doped to the $p^+$-type, the hot electrons are created efficiently in the vicinity of the drain edge and an efficient writing of information is achieved to the floating gate electrode pattern 35.

Further, according to the present invention in which the drain region 31B is formed simultaneously to the step of forming the source line, no thermal annealing process is applied after the drain diffusion region 31B is formed. Thus, the problem of invasion of the drain diffusion region 31B into the channel region underneath the floating gate electrode pattern 35 is suppressed or reduced as indicated in FIG. 19D, in which it should be noted that the tip end of the drain region 31B is located between the side wall of the floating gate electrode pattern 35 and the side wall oxide film 39 covering the side wall of the floating gate electrode pattern 35. Thereby, the problem of short channel effect, which is caused as a result of the excessive reduction of the gate length, which in turn is caused as a result of the diffusion of the impurity element from the drain region into the channel region, is effectively suppressed.

Further, the present invention is not limited to the embodiments described heretofore, but various variations and modifications may be made without departing from the scope of the invention.

What is claimed is:

1. A semiconductor device, comprising:

a substrate;

a gate electrode formed on said substrate;

a first side wall insulation film formed on a first side wall of said gate electrode with a first thickness;

a second side wall insulation film formed on a second side wall of said gate electrode with a second thickness substantially larger than said first thickness;

a first diffusion region formed in said substrate adjacent to said first side wall of said gate electrode;

a second diffusion region formed in said substrate adjacent to said s second side wall of said gate electrode;

said first diffusion region having a first tip end, defining a boundary of said first diffusion region to said substrate, located under said gate electrode, when viewed perpendicularly to a principal surface of said substrate, with a first overlapping distance as measured from an outer surface of said first side wall insulation film, said second diffusion region having a second tip end, defining a boundary of said second diffusion region to said substrate, located inside said second side wall insulation film of said gate electrode with a second overlapping distance as measured from an outer surface of said second side wall, when viewed perpendicularly to said principal surface of said substrate, wherein said first overlapping distance has a magnitude larger than a magnitude of said second overlapping distance, said second tip end of said second diffusion region being located outside said second side wall of said gate electrode, said first diffusion region including therein a third diffusion region having an increased impurity concentration level over said first diffusion region, said third diffusion region including therein a fourth diffusion region having an increased impurity concentration level over said third diffusion region, said second diffusion region including therein no additional diffusion region.

2. A semiconductor device, comprising:

a substrate;

a field insulation film formed on said substrate so as to define an active region;

a gate structure formed on said active region of said substrate, said gate structure including a tunneling insulation film covering said active region, a floating gate electrode provided on said tunneling insulation film, an interlayer insulation film provided on said floating gate electrode, and a control electrode provided on said interlayer insulation film, said gate structure further including a first side wall insulation film on a first side wall of said gate structure and a second side wall insulation film on a second, opposite side wall of said gate structure;

a first diffusion region formed in said active region of said substrate at a first side wall of said gate structure, said first diffusion region including an inner region and an outer region surrounding said inner region, said outer region having an impurity concentration level lower than an impurity concentration level of said inner region;

a second diffusion region formed in said active region of said substrate at a second, opposite side wall of said gate structure, said second diffusion region having a conductivity type identical with a conductivity type of said first diffusion region;

a groove formed in said field insulation film adjacent to said inner region of said first diffusion region, said groove exposing a surface of said substrate; and a third diffusion region in said surface of said substrate exposed by said groove, in continuation with said inner region of said first diffusion region, said third diffusion region having a conductivity type identical with said conductivity type of said first and second diffusion regions, wherein said second diffusion region and said third diffusion region contain a common impurity element with an identical concentration level, and wherein said third diffusion region has a tip end located outside said first side wall of said gate structure with a separation therefrom when viewed perpendicularly to a principal surface of said substrate, an impurity concentration level of said substrate outside said tip end being substantially identical with an impurity concentration level of a channel region right underneath said gate structure, a tip end of said second diffusion region, defined as a boundary of said second diffusion region to said substrate, being located outside said second sidewall of said gate structure, no additional diffusion region being formed outside said second diffusion region between said tip end of said second diffusion region and said second sidewall of said gate structure.

3. A semiconductor device as claimed in claim 2, wherein said semiconductor device is a NOR-type flash memory device.

* * * * *